(12) United States Patent
Stecher et al.

(10) Patent No.: US 7,808,067 B2
(45) Date of Patent: Oct. 5, 2010

(54) SEMICONDUCTOR DEVICE AND TEMPERATURE SENSOR STRUCTURE FOR A SEMICONDUCTOR DEVICE

(75) Inventors: Matthias Stecher, Munich (DE); Joachim Weyers, Hoehenkirchen (DE)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 12/057,944

(22) Filed: Mar. 28, 2008

(65) Prior Publication Data

US 2008/0237772 A1    Oct. 2, 2008

(30) Foreign Application Priority Data

Mar. 29, 2007    (DE) .................. 10 2007 015 295

(51) Int. Cl.
*H01L 31/058* (2006.01)
(52) U.S. Cl. ................ 257/467; 257/470; 257/E21.001
(58) Field of Classification Search ................ 257/470, 257/467, E21.001
See application file for complete search history.

(56) References Cited

U.S. PATENT DOCUMENTS 5,726,481 A    3/1998    Moody
5,969,927 A    10/1999   Schirmer et al.
2001/0035578 A1*  11/2001  Liang et al. .................. 257/706
2002/0072219 A1*  6/2002   Avanzino et al. ............. 438/622

FOREIGN PATENT DOCUMENTS

DE    19644193 C2    5/1998

OTHER PUBLICATIONS

"Taschenbuch Digitaltechnik", Christian Siemers, et al., Fachbuchverlag Leipzig.

* cited by examiner

*Primary Examiner*—Tan N Tran
(74) *Attorney, Agent, or Firm*—Dicke, Billig & Czaja, PLLC

(57) ABSTRACT

A temperature sensor structure for a semiconductor device. One embodiment provides a semiconductor substrate including the semiconductor device. A dissipation region of the semiconductor device is adjacent to a main surface of the semiconductor substrate. A first layer arrangement is disposed on the main surface of the semiconductor substrate adjacent to the dissipation region of the semiconductor device. A second layer arrangement is disposed on the first layer arrangement with an insulation layer for galvanic separation therebetween. The first and second layer arrangements and the insulation layer form a layer structure on the main surface above the dissipation region. A circuit element is disposed in the second layer arrangement, the circuit element having a temperature-dependent characteristic and being coupled thermally to the dissipation region.

26 Claims, 3 Drawing Sheets

SEMICONDUCTOR DEVICE AND TEMPERATURE SENSOR STRUCTURE FOR A SEMICONDUCTOR DEVICE

CROSS-REFERENCE TO RELATED APPLICATIONS

This Utility Patent Application claims priority to German Patent Application No. DE 10 2007 015 295.9 filed on Mar. 29, 2007, which is incorporated herein by reference.

BACKGROUND

The present invention relates to semiconductor devices and for detecting temperatures in semiconductor devices.

In monolithically integrated smart-power circuits, as they are used in automobile electronics or in circuits including bridge drivers, power devices which, due to the switched power dissipation, may heat up to temperatures of more than 150° C. or, in short-term applications limited to only a few switching processes, like in air bag driving, even to barrier layer temperatures of up to 300° C. are employed. These high temperatures may result in a degradation or destruction of the devices and the respective circuits. Detecting and monitoring the temperature of a power device, for example of a Metal-Oxide-Silicon Field-Effect Transistor (MOSFET) or an Isolated-Gate Bipolar Transistors (IGBT), and respective device control and regulation may be necessary to prevent damaging effects on the efficiency on the power device.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
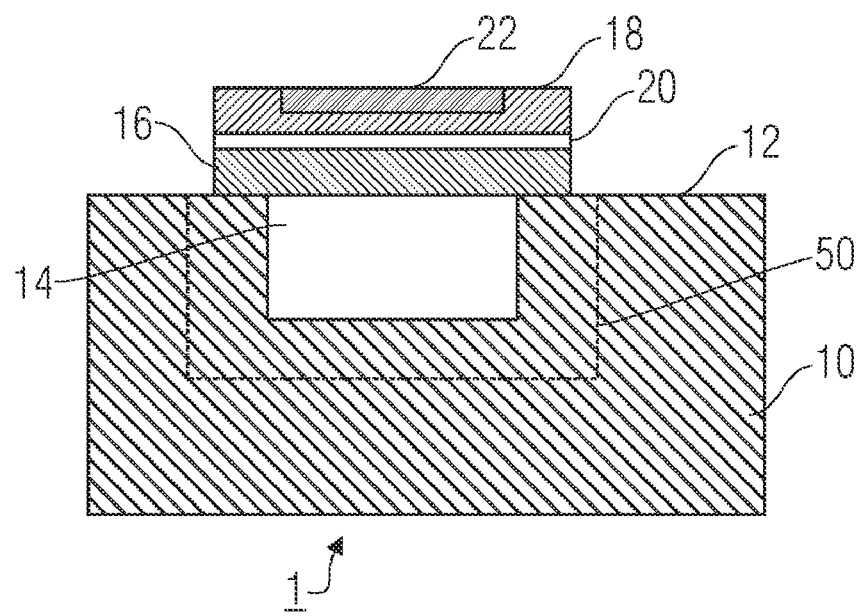
FIG. 1 illustrates a schematic cross section through a temperature sensor structure for a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a semiconductor device including a temperature sensor structure. One embodiment includes a semiconductor substrate, a dissipation region of the semiconductor device being adjacent to a main surface of the semiconductor substrate. A first layer arrangement is disposed on the main surface of the semiconductor substrate adjacent to the dissipation region of the semiconductor device. A second layer arrangement which is disposed on the first layer arrangement with an insulation layer for galvanic separation therebetween forms, together with the first layer arrangement and the insulation layer, a layer structure on the main surface above the dissipation region. Furthermore, a circuit element is disposed in the second layer arrangement, the circuit element including a temperature-dependent characteristic and being coupled thermally to the dissipation region.

The temperature can be determined by the temperature sensor structure to a very precise degree since the temperature sensor can be placed very close to the highest heating region of the power device. This may be achieved by monolithically integrating the temperature sensor structure above the dissipation region of, for example, a power transistor. The distance between the temperature sensor structure and the power transistor may thus be smaller than the extension of the space charge zone of the transistor which may typically be some micrometers, like for example two µm to 10 µm. Despite the relatively small distance, the functionality and precision of the transistor can be guaranteed. In order to guarantee proper functioning of the temperature sensor and the transistor, the two may be separated galvanically and exhibit sufficient thermal coupling.

In one embodiment, in fast transient switching processes with switching times of less than 3 ms, due to the small distance between the temperature-dependent circuit element of the temperature sensor structure and the dissipation region, embodiments can achieve extremely small deviations between the value measured and the actual maximum temperature. When designing the regulating circuit, a big tolerance can thus be dispensed with, which in turn may have advantageous effects on important circuit characteristic parameters, like for example switching power area, chip area and thermal impedance of the casing.

Since the temperature sensor structure can be above the dissipation region, the area consumption of the circuit and thus also the cost for the circuit can be kept small. According to embodiments, a temperature sensor which is area-neutral can be obtained, i.e. the specific on resistance (=Rds (on)× area) of, for example, a power transistor does not increase.

Thus, due to the layer structure of the temperature sensor structure directly above the active region of a semiconductor device, in one embodiment in a small distance of around 200 nm, embodiments of the present invention are able to detect the temperature fast and precisely. The temperature sensor, for example, does not consume any additional area, since the temperature sensor structure may be disposed above the active semiconductor device region. Embodiments of the present invention allow the temperature sensor structure, for example, to be disposed on the semiconductor device region practically as desired and to be manufactured in existing semiconductor processing environments like, for example, the flash processing environment including double polysilicon processing. The result is that no, or hardly any additional process cost arise.

Embodiments of a semiconductor device including the temperature sensor structure for a semiconductor device and the method for manufacturing an integrated temperature sensor structure adjacent to a dissipation region of a semiconductor device will be detailed subsequently referring to the appended FIGS. 1 to 4.

With regard to the following description of embodiments, it should be kept in mind that, for simplification purposes, in the entire description the same reference numerals will be used in different figures for functionally identical equivalent elements and/or equivalent elements having the same effect or same function.

Referring to FIG. 1, a semiconductor device including the setup of a temperature sensor structure for a semiconductor device according to one embodiment will be detailed. The temperature sensor structure 1 for a semiconductor device 50 includes a semiconductor substrate 10 having a main surface 12 and a dissipation region 14. On the main surface adjacent to the dissipation region, there is a first layer arrangement 16 above which a second layer arrangement 18 is disposed with an insulation layer 20 therebetween. In connection, the first and second layer arrangements and the insulation layer form a layer structure on the main surface 12 above the dissipation region. A circuit element 22 is arranged in the second layer arrangement 18, the circuit element including a temperature-dependent characteristic and being coupled thermally to the dissipation region 14.

The first or second layer arrangement of the temperature sensor structure 1 may include polysilicon, but also other insulating or conductive materials used in semiconductor technology. The size and shape of the first and the second layer arrangements may be different, however the layer structure including the first and the second layer arrangements and the insulation layer should be arranged above the dissipation region of the semiconductor device 50. The thickness of this layer structure and the materials used may influence thermal coupling of the temperature-dependent circuit element 22 to the dissipation region. The thickness of the layer structure may, for example, be in a range of 50 to 500 nm, 100 to 300 nm or in a range of roughly 250 nm.

The semiconductor substrate 10 may, for example, include silicon, but also other materials used for realizing the semiconductor device and employed in semiconductor technology, like, for example, SiC, SiGe, GaAs, InP.

The semiconductor device may be a power device, like for example a power transistor, IGBT, MOSFET, power diode, DMOS transistor, thyristor or other semiconductor device, like, for example, a rectifier diode, the temperature detection and monitoring of which is useful. The temperature sensor structure may also be part of a semiconductor device, wherein the semiconductor sensor structure may be integrated monolithically in the semiconductor device. This may, for example, be achieved by using smart-power process technology or other power technologies. The manufacturing of the temperature sensor structure may, for example, also take place in CMOS, BICMOS or bipolar technology and be integrated in conventional semiconductor manufacturing processes.

The semiconductor device 50 may include a dissipation region 14 the temperature of which can be detected and/or monitored and regulated by the temperature sensor structure 1. In the dissipation region of a semiconductor device, heating may arise in the active region due to thermal processes caused, for example, by the recombination of charge carriers. In the dissipation region, a considerable part of the power dissipation of the respective semiconductor device may be dissipated as heat. The layer structure of the first and second layer arrangements with an insulation layer for galvanic separation therebetween may be disposed above the dissipation region of the semiconductor device.

In FIG. 1 and further figures, the circuit element 22 is illustrated as a sub-region of the second layer arrangement 18. However, it is also possible for the second layer arrangement to partly or even completely form the circuit element. A circuit element including a temperature-dependent characteristic may be arranged in the second layer arrangement, wherein the second layer arrangement may be formed partly or even completely as the circuit element including the temperature-dependent characteristic. This means that only portions of the second layer arrangement and/or in the second layer arrangement or the entire second layer arrangement are effective as the circuit element including the temperature-dependent characteristic.

Figure 2:
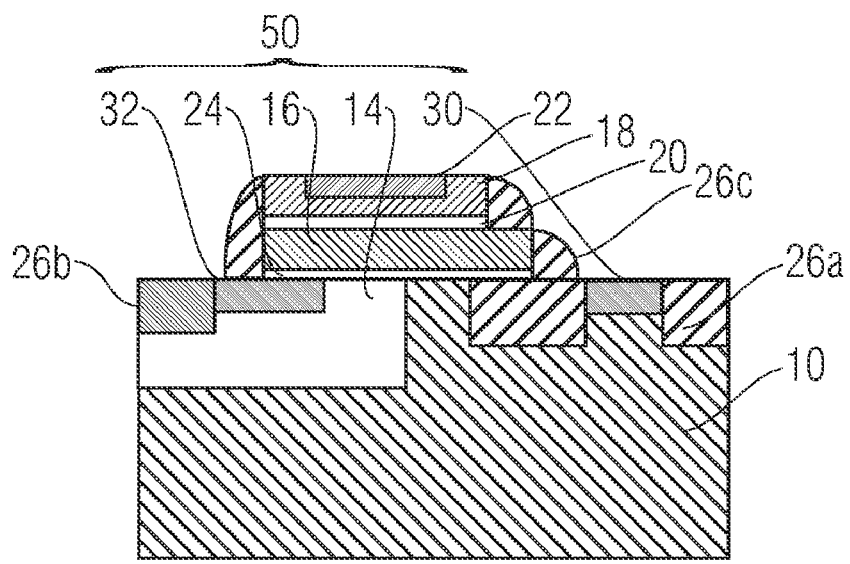
FIG. 2 illustrates a schematic cross section through a temperature sensor structure including a transistor as a semiconductor device according to one embodiment.

Referring to FIG. 2, the setup of the temperature sensor structure 1 for a semiconductor device 50—which here is a transistor—according to one embodiment will be detailed. The transistor may, for example, be a power transistor. The temperature sensor structure 1 for the transistor includes a semiconductor substrate 10 having a dissipation region 14 of a transistor, a first layer arrangement 16 which is disposed on the main surface 12 of the semiconductor substrate 10 adjacent to the dissipation region 14 of the transistor, a second layer arrangement 18 disposed on the first layer arrangement 16 with an insulation layer 20 for galvanic separation therebetween, a source terminal 32 of the transistor, a drain terminal 30 of the transistor and a first layer structure 16 which is implemented as the gate terminal for the transistor. A circuit element 22 disposed in the second layer arrangement 18 may be used for detecting the temperature, the circuit element including a temperature-dependent characteristic and being coupled thermally to the dissipation region 14. Furthermore, regions 26a, 26b, 26c which represent differently doted regions 26b of the semiconductor substrate or even insulation layers, like, for example, a field oxide 26a or the oxide of a spacer 26c as may be present in real semiconductor devices are illustrated in FIG. 2.

The circuit element 22 disposed in the second layer arrangement 18 may, for example, include a resistive element, a diode or a bipolar transistor implemented to provide, responsive to electrical excitation, a signal depending on the temperature of the dissipation region 14, corresponding to its temperature-dependent characteristic. The respective transistor may, when exceeding a predetermined maximum temperature, be switched off via an evaluating unit and a regulating circuit. In a resistive element, the temperature-dependent change in resistance may be employed for determining the temperature. In the diode and the bipolar transistor, the temperature dependence of the current and/or voltage of the semiconductor device may serve for determining the temperature.

The first layer arrangement 16 and the second layer arrangement 18 including a circuit element including a temperature-dependent characteristic may, for example, be a polysilicon material. Thus, the first layer arrangement 16 may form a control terminal for the transistor.

In a flash processing environment (flash technology), there is a way of applying a double polysilicon layer. The first layer arrangement 16 may include polysilicon and serve as a gate terminal for the transistor integrated into the semiconductor substrate 10 with its dissipation region 14, its source terminal 32 and its drain terminal 30. The second layer arrangement 16 may also include polysilicon and be separated from the first layer arrangement by an insulation layer 20, which includes oxide nitride oxide (ONO), the result being galvanic separation thereby preventing the transistor from being influenced electrically by the temperature sensor structure.

The power transistor may be a MOSFET, the layer structure including a further insulation layer 24 between the semiconductor substrate 10 and the first layer arrangement 16. The insulation layer 24 may serve as a gate insulation layer and the first layer arrangement 16 may serve as a control and/or gate terminal for the MOSFET.

The layer structure above the dissipation region 14 of the transistor may include a thickness in a range of 50 to 500 nm, 100 to 300 nm or, in one embodiment, in a range around 250 nm. The thermal resistance of the insulation layer 24 which, for example, includes oxide and the insulation layer 20 which, for example, includes oxide nitride oxide may be greater by a factor of 10 compared to silicon. However, the thermal resistance portion may be smaller compared to a silicon region having an extension of several μm for forming a temperature sensor arranged next to the dissipation region when the overall thickness of the insulation layer 24 and the insulation layer 20 in one embodiment is 50 nm or the insulation layer 24 in one embodiment has a thickness of 26 nm and the insulation layer 20 in one embodiment has a thickness of 22 nm.

The temperature sensor for a power transistor in the second layer arrangement 18 may include two bipolar transistors as temperature-dependent circuit elements. The two should include equal temperatures for correct functioning, which is why the temperature gradient between the two bipolar transistors should be as small as possible and thus the temperature sensor should be arranged galvanically separate but with good thermal coupling, as close as possible, for example above the active region of the power transistor.

Figure 3:
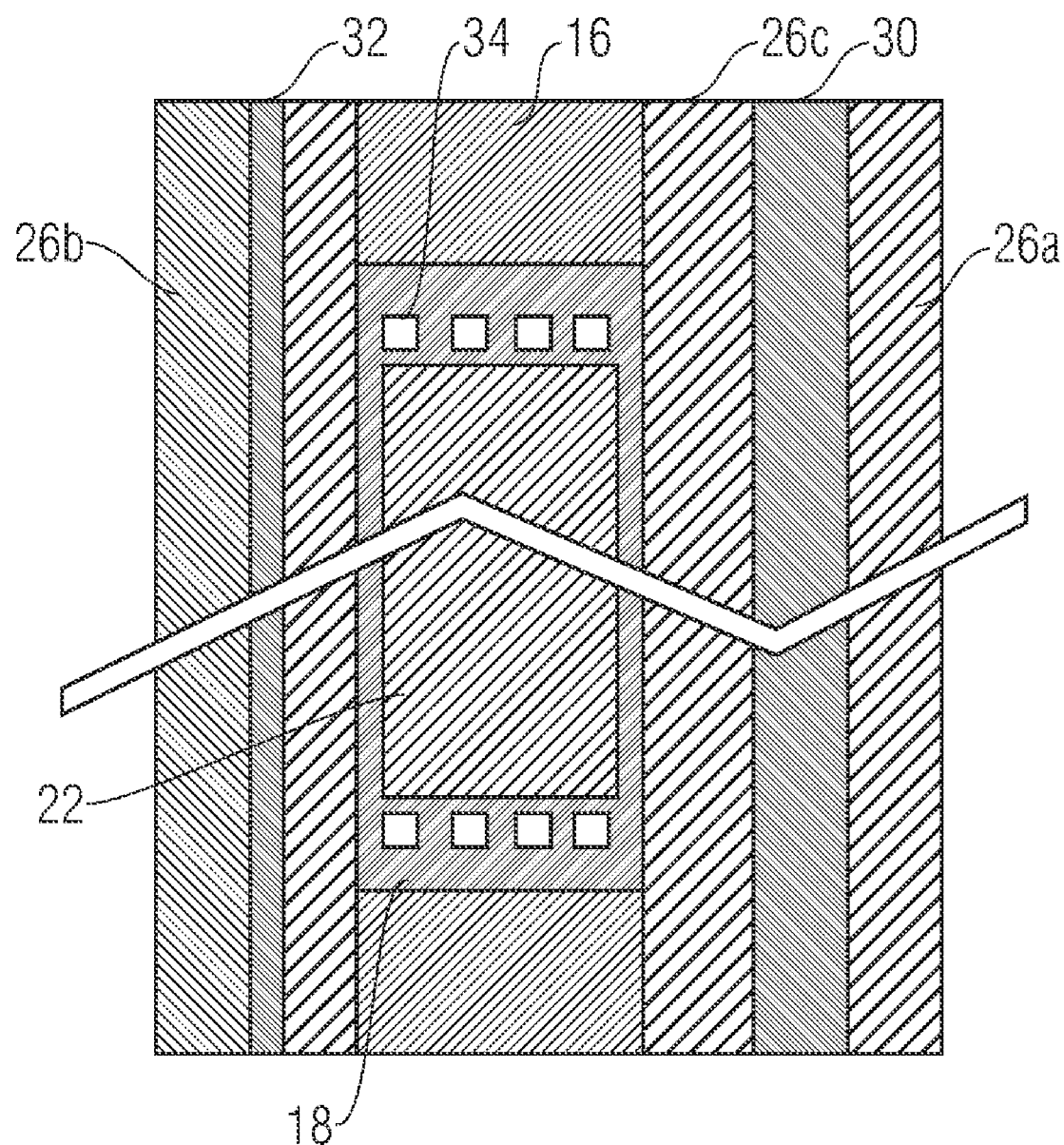
FIG. 3 illustrates a schematic top view of a temperature sensor structure including a transistor as a semiconductor device according to one embodiment.

FIG. 3 illustrates the top view of a temperature structure 1 for a power transistor with its source terminal 32, the drain terminal 30 and the first layer arrangement 16 which may serve as a gate terminal. A second layer arrangement 18 disposed on the first layer arrangement with an insulation layer for galvanic separation therebetween forms a layer structure on the main surface above the dissipation region of the transistor. A circuit element 22 may be arranged in the second layer arrangement 18, the circuit element including a temperature-dependent characteristic and being coupled thermally to the dissipation region. The circuit element may be implemented so as to be a resistive element, a diode or a bipolar transistor in order to provide a signal dependent on the temperature of the active region of the power transistor, corresponding to the temperature-dependent characteristic thereof.

The second layer arrangement 18 may also include measuring terminals 34 for the temperature-dependent circuit element disposed in the second layer arrangement. The measuring terminals may be formed on the second layer arrangement in a siliconizing process. Using the structuring option of silicide, a short between the measuring terminals 34 can be avoided. The measuring terminals 34 may be implemented such that they couple the signals provided by the circuit element 22 including the temperature-dependent characteristic, the signals depending on the temperature of the dissipation region, to an evaluating unit. The temperature sensor structure may be implemented such that it does not consume additional chip area, since the temperature sensor structure can be disposed above the semiconductor device, for example the dissipation region of a power transistor. The size and shape of the first and second layer structures here may be different.

Figure 4:
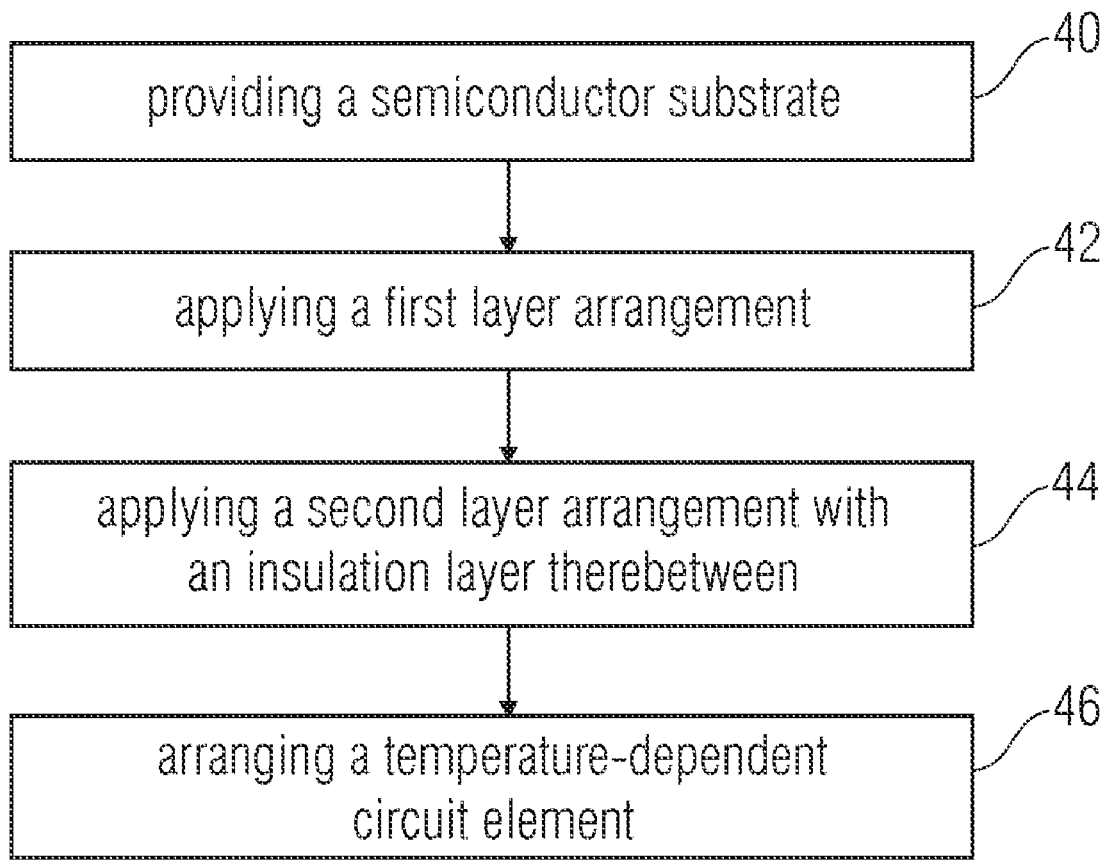
FIG. 4 illustrates a schematic flow chart of the method for manufacturing an integrated temperature sensor structure adjacent to a dissipation region of a semiconductor device according to one embodiment.

A flow chart illustrating one embodiment of a method for manufacturing an integrated temperature sensor structure adjacent to a dissipation region of a semiconductor device is illustrated in FIG. 4.

One method for manufacturing an integrated temperature sensor structure adjacent to a dissipation region of a semiconductor device includes providing 40 a semiconductor substrate including an integrated semiconductor device, applying 42 a first layer arrangement on the semiconductor device, the first layer arrangement being above the dissipation region of the semiconductor device, applying 44 a second layer arrangement on the first layer arrangement with the insulation layer therebetween, the first and second layer arrangements and the insulation layer forming a layer structure on the main surface above the dissipation region of the semiconductor device, and arranging 46 a circuit element including a temperature-dependent characteristic and being coupled thermally to the dissipation region of the semiconductor device, in the second layer arrangement.

The semiconductor substrate including an integrated semiconductor device may, for example, be an Si substrate, SiGe substrate, SiC substrate, GaAs substrate or other substrate materials used in semiconductor technology. The integrated semiconductor device may, for example, be a power device, for example, a power transistor, IGBT, thyristor, power diode, but also a bipolar transistor or another semiconductor device including a dissipation region.

Applying 42 a first layer arrangement on the semiconductor device should take place such that the first layer arrangement is disposed above the dissipation region of the semiconductor device. The insulation layer may be an insulating dielectric layer, including oxide or nitride or a combination of oxide-nitride-oxide. Applying 44 a second layer arrangement on the first layer arrangement with an insulation layer for galvanic separation therebetween should take place such that the first and second layer arrangements and the insulation layer form a layer structure above the dissipation region of the semiconductor device.

Applying the second layer arrangement may also be performed such that the second layer arrangement is formed partly or even completely as the circuit element including the temperature-dependent characteristic. This means that applying is performed such that only portions of the second layer arrangement and/or portions in the second layer arrangement or even the entire second layer arrangement are effective as the circuit element including the temperature-dependent characteristic.

The structuring of the first and second layer arrangements and the insulation layer therebetween may take place using the methods of covering with a resist and irradiating by electromagnetic radiation or particles through a suitable mask conventionally used in semiconductor technology. By applying the lithography, etching, baking and doping technologies known from semiconductor technology, if appropriate, several times, completely structuring the temperature sensor structure on the semiconductor substrate can be achieved.

When arranging a circuit element including a temperature-dependent characteristic which, responsive to electrical excitation, may provide a signal depending on the temperature of the dissipation region, the circuit element may, for example, be a resistive element, a diode or a bipolar transistor. The circuit element of the temperature-dependent characteristic should exhibit an unambiguous temperature dependence easy to be interpreted. When the second layer arrangement is a layer including polysilicon, a poly resistor or poly diode may be formed. The temperature dependence of the diode voltage of a poly diode may be used for deriving the temperature. Here, the polysilicon should exhibit the appropriate n/p doping. The doping may be obtained by thermal diffusion or implantation. When the first layer arrangement is a polysilicon layer and the second layer arrangement also is a polysilicon layer, manufacturing an integrated temperature sensor structure adjacent to a dissipation region of a semiconductor device may be performed in a flash processing environment by a double polysilicon process, as is used for manufacturing monolithically integrated smart-power circuits.

Manufacturing the temperature sensor structure and/or the semiconductor device including the temperature sensor structure may also be performed in another semiconductor process architecture, like, for example, bipolar, BICMOS or bipolar/CMOS/DMOS technology. Optionally, the circuit element including the temperature-dependent characteristic may also be integrated in the first layer arrangement so as to support a different functionality of the semiconductor device.

It is also conceivable for the temperature sensor structure to be coupled to further temperature sensor structures or conventional temperature sensors which detect a comparative temperature at a different location, and a regulating circuit such that a change in the functioning of the temperature sensor structure, like, for example, switching off the monitored semiconductor device, will result from the difference of the temperatures detected separately in space and the temperature-dependent signals resulting from this.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A temperature sensor for a semiconductor device, comprising:
a semiconductor substrate for the semiconductor device including a dissipation region of the semiconductor device being adjacent to a main surface of the semiconductor substrate;
a first layer arrangement disposed on the main surface of the semiconductor substrate above the dissipation region of the semiconductor device;
a second layer arrangement disposed on the first layer arrangement with an insulation layer for galvanic separation therebetween, the first and second layer arrangements and the insulation layer forming a layer structure on the main surface above the dissipation region; and
a temperature sensing element disposed in the second layer arrangement, the temperature sensing element having a temperature-dependent characteristic and being coupled thermally to the dissipation region, wherein the temperature sensing element is configured to provide, in response to electrical excitation, a signal dependent on the temperature of the dissipation region and on the temperature-dependent characteristic.

2. The temperature sensor of claim 1, wherein the first and/or second layer arrangements comprise a polysilicon material.

3. The temperature sensor of claim 1, wherein the semiconductor device comprises a power transistor.

4. The temperature sensor of claim 3, wherein the first layer arrangement forms a control terminal for the power transistor.

5. The temperature sensor of claim 3, wherein the distance between the temperature sensing element and the dissipation region of the semiconductor device is smaller than the extension of a space charge zone of the power transistor in the semiconductor substrate.

6. The temperature sensor of claim 1, wherein the semiconductor device comprises a power MOS (Metal Oxide Silicon) field-effect transistor, the layer structure comprising another insulation layer between the semiconductor substrate and the first layer arrangement.

7. The temperature sensor of claim 6, comprising wherein the first layer arrangement forms a gate terminal for the power MOS field-effect transistor and the another insulation layer is implemented as a gate insulation of the power MOS field-effect transistor.

8. The temperature sensor of claim 1, wherein the temperature sensing element comprises a resistive element, diode or bipolar transistor.

9. The temperature sensor of claim 1, comprising wherein the second layer arrangement is formed partly or even completely as the circuit element comprising the temperature-dependent characteristic.

10. A semiconductor device including a temperature sensor comprising:
a semiconductor substrate including a dissipation region of the semiconductor device adjacent to a main surface of the semiconductor substrate;
a first layer arrangement disposed on the main surface of the semiconductor substrate above the dissipation region of the semiconductor device;
a second layer arrangement disposed on the first layer arrangement with an insulation layer for galvanic separation therebetween, the first and second layer arrangements and the insulation layer forming a layer structure on the main surface above the dissipation region; and
a temperature sensing element disposed in the second layer arrangement, the temperature sensing element comprising a temperature-dependent characteristic and being coupled thermally to the dissipation region, wherein the temperature sensing element is configured to provide, in response to electrical excitation, a signal dependent on the temperature of the dissipation region and on the temperature-dependent characteristic.

11. The semiconductor device of claim 10, wherein the first and/or second layer arrangements comprise a polysilicon material.

12. The semiconductor device of claim 10, wherein the semiconductor device comprises a power transistor, the first layer arrangement forming a control terminal for the power transistor.

13. The semiconductor device of claim 10, wherein the semiconductor device comprises a power MOS (Metal Oxide Silicon) field-effect transistor, the layer structure comprising an another insulation layer between the semiconductor substrate and the first layer arrangement, the first layer arrangement forming a gate terminal for the power MOS field-effect transistor, and the another insulation layer being implemented as a gate insulation of the power MOS field-effect transistor.

14. The semiconductor device of claim 10, wherein the layer structure comprises a thickness in a range of 50 to 500 nm, 100 to 300 nm or in a range of around 250 nm.

15. The semiconductor device of claim 10, wherein the temperature sensing element comprising the temperature-dependent characteristic comprises a resistive element, diode or bipolar transistor and is implemented to provide, responsive to electrical excitation, a signal depending on the temperature of the dissipation region, corresponding to the temperature-dependent characteristic thereof.

16. The semiconductor device of claim 10, wherein the second layer arrangement is formed partly or even completely as the circuit element comprising the temperature-dependent characteristic.

17. A semiconductor device including a temperature sensor comprising:
a power transistor, an active region of the power transistor being disposed in the semiconductor substrate adjacent to a main surface of the semiconductor substrate;
a first polysilicon layer being disposed adjacent to the main surface of the semiconductor substrate above the active region of the power transistor, and the first polysilicon layer being effective as a control electrode for the power transistor;
a second polysilicon layer disposed on the first polysilicon layer with an insulation layer for galvanic separation therebetween, the first and second polysilicon layers and the insulation layer forming a layer structure on the main surface above the active region; and
a temperature sensing element disposed in the second polysilicon layer, the temperature sensing element comprising a temperature-dependent characteristic and being coupled thermally to the active region of the power transistor, wherein the temperature sensing element is configured to provide, in response to electrical excitation, a signal depending on the temperature of the dissipation region and the temperature-dependent characteristic.

18. The temperature sensor of claim 17, wherein the first polysilicon layer is implemented as a gate terminal for the power MOS field-effect transistor, and an another insulation layer being effective as a gate insulation of the power MOS field-effect transistor.

19. The temperature sensor of claim 17, comprising wherein the circuit element is implemented to provide a signal depending on the temperature of the active region of the power transistor, corresponding to the temperature-dependent characteristic thereof, the temperature sensing element comprising a resistive element, diode or bipolar transistor.

20. The temperature sensor of claim 17, comprising wherein the second polysilicon layer is implemented partly or even completely as the temperature sensing element comprising the temperature-dependent characteristic.

21. A method comprising:
providing a semiconductor substrate comprising an integrated semiconductor device including a dissipation region of the semiconductor device being adjacent to a main surface of the semiconductor substrate;
applying a first layer arrangement on the main surface of the semiconductor substrate above the dissipation region of the semiconductor device;
applying a second layer arrangement on the first layer arrangement with an insulation layer for galvanic separation therebetween, the first and second layer arrangements and the insulation layer forming a layer structure on the main surface above the dissipation region of the semiconductor device; and
arranging in the second layer arrangement a temperature sensing element comprising a temperature-dependent characteristic and being coupled thermally to the dissipation region.

22. The method of claim 21, wherein the first and/or second layer arrangements comprise a polysilicon material.

23. The method of claim 21, wherein the semiconductor device comprises a power transistor, further comprising:
implementing the first layer arrangement as a control terminal for the power transistor.

24. The method of claim 21, wherein the semiconductor device is implemented as a power MOS field-effect transistor, further comprising:
applying a further insulation layer between the first layer arrangement and the semiconductor substrate before applying the first layer arrangement.

25. The method of claim 21, comprising arranging the temperature sensing element in the second layer arrangement such that the second layer arrangement partly or even completely forms the temperature sensing element comprising the temperature-dependent characteristic.

26. A method for manufacturing a semiconductor device comprising an integrated temperature sensor above a dissipation region of the semiconductor device, comprising:
providing a semiconductor substrate comprising the integrated semiconductor device, including a dissipation region of the semiconductor device being adjacent to a main surface of the semiconductor substrate;
applying a first layer arrangement on the semiconductor device, the first layer arrangement being on a main surface of the semiconductor substrate above the dissipation region of the semiconductor device;
applying a second layer arrangement on the first layer arrangement with an insulation layer for galvanic separation therebetween, the first and second layer arrangements and the insulation layer forming a layer structure on the main surface above the dissipation region of the semiconductor device; and
arranging a temperature sensing element comprising a temperature-dependent characteristic and being coupled thermally to the dissipation region, in the second layer arrangement.

* * * * *